(12) United States Patent
Takeda et al.

(10) Patent No.: US 9,040,815 B2
(45) Date of Patent: May 26, 2015

(54) THIN-FILM SOLAR CELL AND METHOD OF FABRICATING THIN-FILM SOLAR CELL

(75) Inventors: Tohru Takeda, Osaka (JP); Kazuhito Nishimura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 121 days.

(21) Appl. No.: 13/877,242

(22) PCT Filed: Sep. 27, 2011

(86) PCT No.: PCT/JP2011/072028
§ 371 (c)(1),
(2), (4) Date: Apr. 1, 2013

(87) PCT Pub. No.: WO2012/043539
PCT Pub. Date: Apr. 5, 2012

(65) Prior Publication Data
US 2013/0180567 A1    Jul. 18, 2013

(30) Foreign Application Priority Data
Sep. 30, 2010    (JP) .................................. 2010-220599

(51) Int. Cl.
*H01L 31/05*    (2014.01)
*H01L 31/02*    (2006.01)
*H01L 31/046*    (2014.01)

(52) U.S. Cl.
CPC ............. *H01L 31/0516* (2013.01); *Y02E 10/50* (2013.01); *H01L 31/0201* (2013.01); *H01L 31/046* (2013.01)

(58) Field of Classification Search
USPC ......................................... 136/244, 252, 256
See application file for complete search history.

(56) References Cited

U.S. PATENT DOCUMENTS

| 2009/0272434 A1 | 11/2009 | Tachibana |
| 2010/0163106 A1 | 7/2010 | Tachibana |
| 2011/0146749 A1* | 6/2011 | Nasuno et al. ................ 136/244 |

FOREIGN PATENT DOCUMENTS

| JP | 57-163753 | 10/1982 |
| JP | 09-083001 | 3/1997 |
| JP | 09-307127 | 11/1997 |
| JP | 2000-261019 | 9/2000 |
| JP | 2002-261314 | 9/2000 |
| JP | 2000-277764 | 10/2000 |

(Continued)

OTHER PUBLICATIONS

International Search Report for PCT/JP2011/072028, mailed Dec. 13, 2011.

*Primary Examiner* — Susan D Leong
(74) *Attorney, Agent, or Firm* — Nixon & Vanderhye, P.C.

(57) ABSTRACT

A thin-film solar cell includes a cell having a transparent electrode layer, a photoelectric conversion layer, and a back electrode layer stacked on a transparent insulation substrate. A plurality of cells are connected in series to constitute a cell string. A bus bar is arranged on the back electrode layer of an end cell constituting the cell string. The thin-film solar cell has a photoelectric conversion layer on a series-connection direction end of the transparent electrode layer. In plan view, a series-connection direction end of the back electrode layer at an end of the cell string and the series-connection direction end of the transparent electrode layer at the end of the cell string do not overlap, while the bus bar and the transparent electrode layer at the end cell constituting the cell string overlap at least partially. A method of fabricating the thin-film solar cell is provided.

6 Claims, 7 Drawing Sheets

(56) References Cited

FOREIGN PATENT DOCUMENTS

| JP | 2000-349325 | 12/2000 |
| JP | 2002-314104 | 10/2002 |
| JP | 2003-133570 | 5/2003 |
| JP | 2003-264308 | 9/2003 |
| JP | 2006-319215 | 11/2006 |
| JP | 2007-035695 | 2/2007 |
| JP | 2008-109041 | 5/2008 |
| JP | 2010-172959 | 8/2010 |
| JP | 2010-177557 | 8/2010 |
| WO | WO 2008/152865 | 12/2008 |

* cited by examiner

THIN-FILM SOLAR CELL AND METHOD OF FABRICATING THIN-FILM SOLAR CELL

This application is the U.S. national phase of International Application No. PCT/JP2011/072028, filed 27 Sep. 2011, which designated the U.S. and claims priority to JP Application No. 2010-220599, filed 30 Sep. 2010, the entire contents of each of which are hereby incorporated by reference.

TECHNICAL FIELD

The present invention relates to a thin-film solar cell and a method of fabricating a thin-film solar cell.

BACKGROUND ART

Various types of solar cells converting the energy of sunlight directly into electric energy are now put into practical use. Particularly, development of a thin-film solar cell employing a thin film of amorphous silicon or microcrystalline silicon is now in progress in view of allowing fabrication at low cost by virtue of the low-temperature process and area increase.

Figure 10:
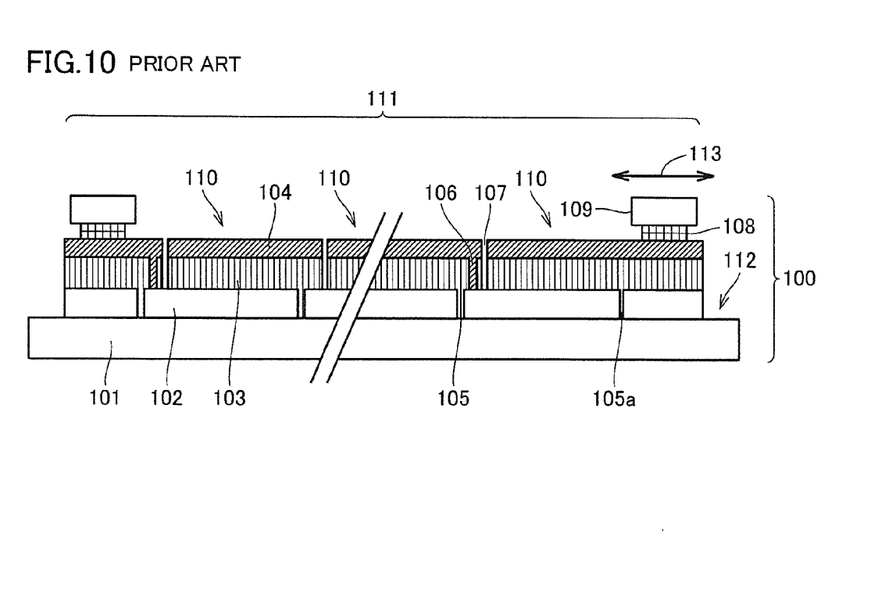
FIG. 10 is a schematic sectional view of an example of a conventional thin-film solar cell disclosed in PTL 1.

FIG. 10 is a schematic sectional view of an example of a conventional thin-film solar cell disclosed in PTL 1 (WO2008/152865). A thin-film solar cell 100 has a configuration in which a transparent conductor film 102, a photoelectric conversion layer 103 constituted of an amorphous silicon thin film, and a back electrode layer 104 are stacked in the cited order on a translucent insulation substrate 101.

Transparent conductor film 102 is separated into strips by separation lines 105, 105a filled with photoelectric conversion layer 103. Photoelectric conversion layer 103 and back electrode layer 104 are separated into strips by a separation line 107. Then, through a contact line 106 where photoelectric conversion layer 103 is removed by patterning using a laser beam or the like, adjacent cells 110 are electrically connected in series to constitute a cell string 111.

A bus bar 109 is provided at each end of cell string 111 in the direction of series connection of cell 110, at the surface of back electrode layer 104 with conductive tape 108 therebetween.

A method of fabricating conventional thin-film solar cell 100 shown in FIG. 10 will be described hereinafter. First, transparent conductor film 102 is stacked on translucent insulation substrate 101. Then, by laser scribing, transparent conductor film 102 is removed in strips to form separation lines 105, 105a.

By plasma CVD, a p layer, an i layer, and an n layer formed of an amorphous silicon thin film are sequentially stacked so as to cover transparent conductor film 102 separated in strips by separation lines 105, 105a to constitute photoelectric conversion layer 103. Then, photoelectric conversion layer 103 is removed in strips by laser scribing to form contact line 106.

Next, back electrode layer 104 is stacked so as to cover photoelectric conversion layer 103. Accordingly, contact line 106 is filled with back electrode layer 104.

Then, by laser scribing, separation line 107 separating photoelectric conversion layer 103 and back electrode layer 104 is formed. Accordingly, on translucent insulation substrate 101, a cell string 111 having a plurality of cells 110 connected electrically in series is formed, each cell including a transparent conductor film 102, a photoelectric conversion layer 103, and a back electrode layer 104 stacked in the cited order. The electrical connection of cells 110 is effected by bringing transparent conductor film 102 of one of adjacent cells 110 in contact with back electrode layer 104 of the other of adjacent cells 110 through contact line 106.

Then, following the attachment of a conductive tape 108 at each end of the surface of back electrode layer 104 in the direction of cells 110 in series connection, a bus bar 109 is provided. Thus, a conventional thin-film solar cell 100 is produced.

CITATION LIST

Patent Literature

PTL 1: WO2008/152865

SUMMARY OF INVENTION

Technical Problem

At the perimeter region of thin-film solar cell 100, there is provided an insulation region to prevent electrical leakage from the standpoint of safety.

Therefore, at a predetermined region of the perimeter portion of thin-film solar cell 100, transparent conductor film 102, photoelectric conversion layer 103 and back electrode layer 104 are removed to provide an insulation region 112 where the surface of translucent insulation substrate 101 is exposed.

However, for the purpose of forming insulation region 112 at thin-film solar cell 100, the surface of translucent insulation substrate 101 had to be cleaned after transparent conductor film 102, photoelectric conversion layer 103, and back electrode layer 104 were removed by polishing, leading to the problem of higher fabrication cost of thin-film solar cell 100.

Alternative to the aforementioned method of polishing and cleaning, the method of directing a laser beam to transparent conductor film 102, photoelectric conversion layer 103 and back electrode layer 104 to remove these layers at one time and forming insulation region 112 (laser scribing) is employed. The laser scribing method is advantageous in that the fabrication cost of thin-film solar cell 100 can be reduced since insulation region 112 can be provided more efficiently than the method employing polishing and cleaning.

Figure 11:
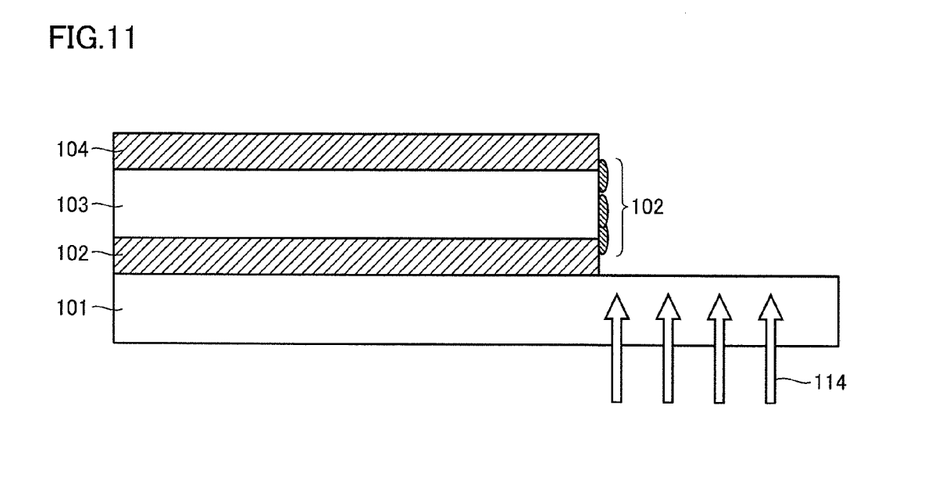
FIG. 11 is a schematic enlarged sectional view for illustrating a transparent conductor film evaporated by irradiation with a laser beam partially adhering to a photoelectric conversion layer.

In the case where laser scribing is employed, transparent conductor film 102 evaporated by the radiation of laser beam 114 will partially adhere to photoelectric conversion layer 103, as shown in the schematic enlarged sectional view of FIG. 11, resulting in a leak path. Current will flow through the leak path to degrade the output of thin-film solar cell 100.

Therefore, separation line 105a is formed at transparent conductor film 102 of cell 110 located at the end among cells 110 in the series-connection direction, as shown in FIG. 10. Accordingly, the region below bus bar 109 serves as an invalid region 113 where power is not generated to suppress reduction in the output of thin-film solar cell 100 through a leak path.

However, in the case where the region below bus bar 109 in thin-film solar cell 100 is entirely taken as invalid region 113, the region for generating power in thin-film solar cell 100 as a whole cannot be increased, leading to the problem of insufficient output.

In view of the foregoing, an object of the present invention is to provide a thin-film solar cell that can have output improved by preventing leakage at the end and providing a large valid region for power generation, and a method of fabricating the thin-film solar cell.

Solution to Problem

The present invention is directed to a thin-film solar cell, including a cell having a transparent electrode layer, a photoelectric conversion layer, and a back electrode layer sequentially stacked on a transparent insulation substrate. A plurality of the cells are connected in series to constitute a cell string. A bus bar is arranged on a back electrode layer of an end cell constituting the cell string. The thin-film solar cell has a photoelectric conversion layer on a series-connection direction end of the transparent electrode layer. In plan view, a series-connection direction end of a back electrode layer at an end of the cell string and the series-connection direction end of the transparent electrode layer at an end of the cell string do not overlap while the bus bar and a transparent electrode layer of the end cell constituting the cell string overlap at least partially.

In the thin-film solar cell of the present invention, a photoelectric conversion layer of the end cell constituting the cell string may be separated from a photoelectric conversion layer on the series-connection direction end of the transparent electrode layer at the end of the cell string.

In the thin-film solar cell of the present invention, the series-connection direction end of the transparent electrode layer at the end cell constituting the cell string may be covered with a photoelectric conversion layer.

The present invention is directed to a method of fabricating a thin-film solar cell, including the steps of: forming a first separation trench separating a transparent electrode layer stacked on a transparent insulation substrate; stacking a photoelectric conversion layer on the transparent electrode layer having the first separation trench formed; forming a contact line separating the photoelectric conversion layer; stacking a back electrode layer on the photoelectric conversion layer having the contact line formed; forming a cell string including a plurality of cells connected in series by forming a second separation trench separating the photoelectric conversion layer and the back electrode layer; removing the transparent electrode layer, the photoelectric conversion layer, and the back electrode layer, located at a perimeter of the transparent insulation substrate by irradiation with a laser beam; and arranging a bus bar on the back electrode layer of the end cell constituting the cell string. The step of removing is carried out such that the photoelectric conversion layer is located on a series-connection direction end of the transparent electrode layer, and in plan view, a series-connection direction end of a back electrode layer at an end of the cell string and a series-connection direction end of the transparent electrode layer at an end of the cell string do not overlap. The step of arranging is carried out such that, in plan view, the bus bar overlaps the transparent electrode layer of the end cell constituting the cell string at least partially.

The method of fabricating a thin-film solar cell of the present invention further includes the step of forming a perimeter trench surrounding the perimeter of the cell string. In the step of removing, the transparent electrode layer, the photoelectric conversion layer, and the back electrode layer, located at an outer side of the perimeter trench may be removed.

In the step of removing in the method of fabricating a thin-film solar cell of the present invention, the transparent electrode layer, the photoelectric conversion layer, and back electrode layer are preferably removed such that the transparent electrode layer partially remains, or not remains, at a side outer than the first separation trench located at the most end in a series-connection direction of the transparent electrode layer.

Advantageous Effects of Invention

According to the present invention, there can be provided a thin-film solar cell that can have output improved by preventing leakage at the end and providing a large valid region for power generation, and a method of fabricating the thin-film solar cell.

BRIEF DESCRIPTION OF DRAWINGS

FIGS. 3 (a)-(h) are schematic sectional views for illustrating an example of a method of fabricating a thin-film solar cell according to the first embodiment.

FIGS. 6 (a)-(h) are schematic sectional views for illustrating an example of a method of fabricating a thin-film solar cell according to the second embodiment.

FIG. 9 (a)-(h) are schematic sectional views for illustrating an example of a method of fabricating a thin-film solar cell according to the third embodiment.

DESCRIPTION OF EMBODIMENTS

Embodiments of the present invention will be described hereinafter. In the drawings of the present invention, the same reference characters represent the same or corresponding element.

(First Embodiment)

Figure 1:
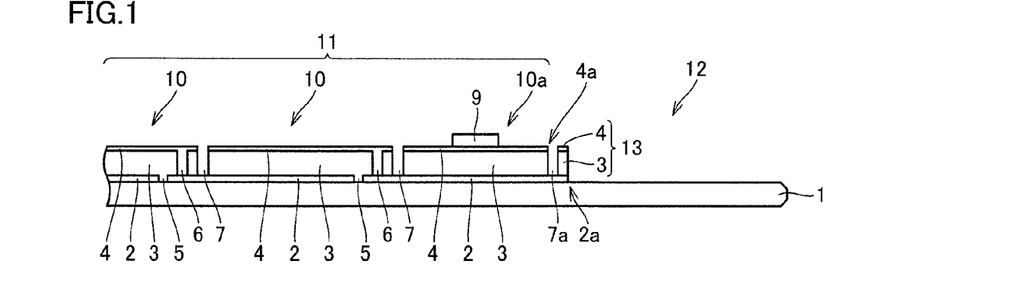
FIG. 1 is a schematic sectional view of a series-connection direction end of cells in a thin-film solar cell according to a first embodiment.

FIG. 1 is a schematic sectional view of an end in the direction of series connection (hereinafter, also simply referred to as "series-connection direction") of cells in a thin-film solar cell according to a first embodiment. The thin-film solar cell of the first embodiment includes a transparent insulation substrate 1, and a cell string 11 provided on transparent insulation substrate 1.

Cell string 11 includes a plurality of cells 10 connected electrically in series, and an end cell 10a as a cell located at the end constituting cell string 11.

Each of cells 10 and end cell 10a includes transparent electrode layer 2, a photoelectric conversion layer 3, and a back electrode layer 4, sequentially stacked from the side of transparent insulation substrate 1.

Transparent electrode layer 2 is separated by a first separation trench 5. Every cell is configured to have transparent electrode layer 2.

Photoelectric conversion layer 3 and back electrode layer 4 each are separated by a second separation trench 7. Every cell is configured to have photoelectric conversion layer 3 and back electrode layer 4.

Transparent electrode layer 2 of cell 10 is electrically connected to back electrode layer 4 of an adjacent cell 10 through a contact line 6. Accordingly, cells 10 are connected to each other electrically in series sequentially in the series-connection direction to constitute cell string 11. At the series-connection direction end of cell string 11, transparent electrode layer 2 of end cell 10a is electrically connected to back electrode layer 4 of cell 10 adjacent to end cell 10a through contact line 6, whereby end cell 10a and cell 10 adjacent to end cell 10a are electrically connected in series.

A bus bar 9 formed of a conductive member is arranged on back electrode layer 4 of end cell 10a. Bus bar 9 is located above transparent electrode layer 2 of end cell 10a. Bus bar 9 is provided to draw out the electric power generated at the thin-film solar cell, and is electrically connected to back electrode layer 4 of end cell 10a.

A laminate 13 of photoelectric conversion layer 3 and back electrode layer 4 is arranged at the outer side of photoelectric conversion layer 3 of end cell 10a in the series-connection direction. Laminate 13 is provided on transparent electrode layer 2 located on transparent insulation substrate 1 of end cell 10a. In other words, photoelectric conversion layer 3 is situated on a series-connection direction end 2a of transparent electrode layer 2.

Photoelectric conversion layer 3 of end cell 10a and photoelectric conversion layer 3 of laminate 13 are arranged apart from each other with a perimeter trench 7a therebetween. Back electrode layer 4 of end cell 10a and back electrode layer 4 of laminate 13 are arranged apart from each other with perimeter trench 7a therebetween.

In other words, photoelectric conversion layer 3 of end cell 10a constituting cell string 11 and photoelectric conversion layer 3 on series-connection direction end 2a of transparent electrode layer 2 at the end of cell string 11 are separated.

An insulation region 12 exposing a surface of transparent insulation substrate 1 is provided at a side further outer than laminate 13 in the series-connection direction.

Figure 2:
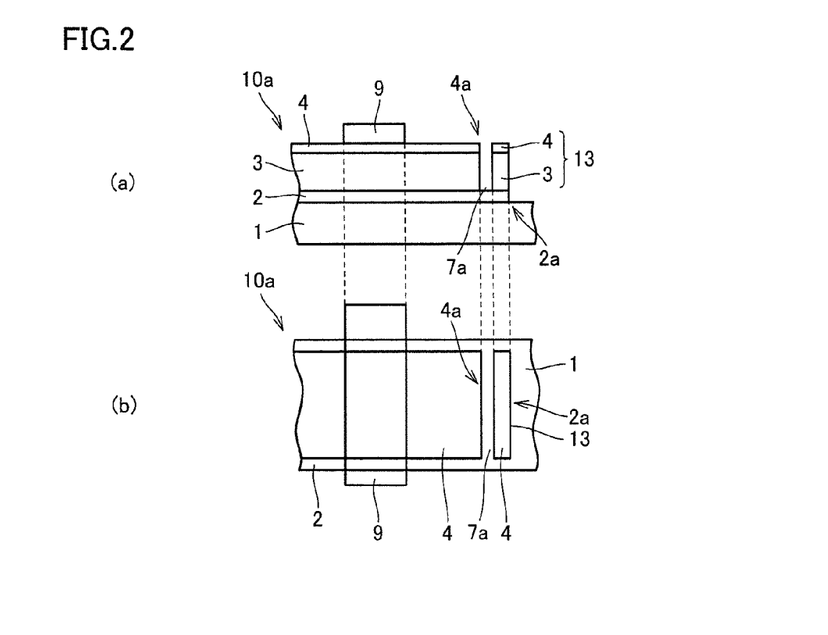
FIG. 2 represents a schematic enlargement of the proximity of an end cell in the thin-film solar cell of the first embodiment shown in FIG. 1, wherein (a) is a sectional view and (b) is a plan view of (a).

FIG. 2 represents a schematic enlargement of the proximity of an end cell in the thin-film solar cell of the first embodiment shown in FIG. 1, wherein (a) is a sectional view and (b) is a plan view of (a)

In the plan view of FIG. 2 (b), a series-connection direction end 4a of back electrode layer 4 at the end of cell string 11 and series-connection direction end 2a of transparent electrode layer 2 at the end of cell string 11 do not overlap in the thin-film solar cell of the first embodiment. Further in the plan view of FIG. 2 (b), bus bar 9 and transparent electrode layer 2 of end cell 10a overlap at least partially.

Referring to the schematic sectional views of FIGS. 3 (a)-3 (h), an example of a method of fabricating a thin-film solar cell of the present embodiment will be described hereinafter.

Figure 3:
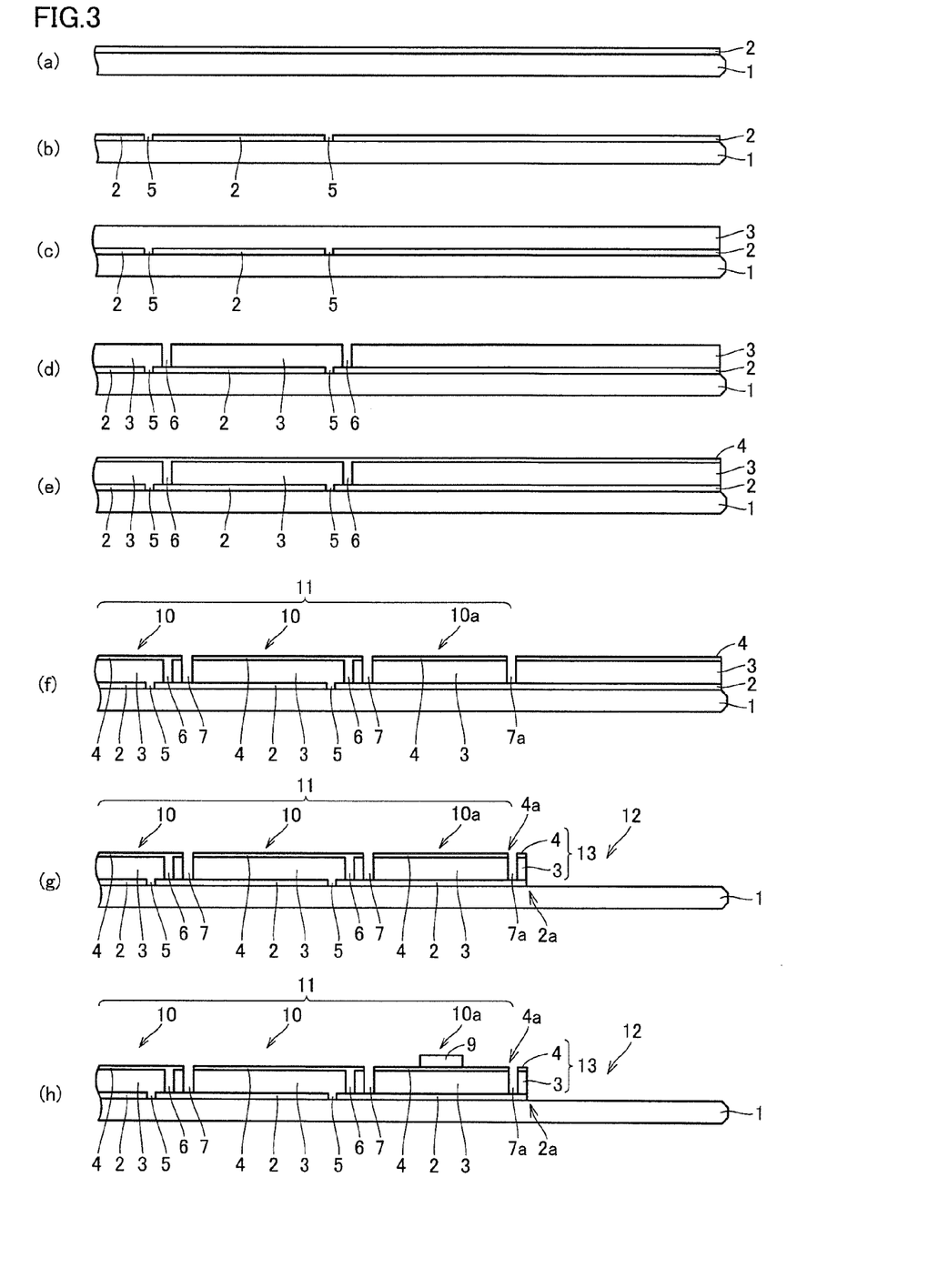

As shown in FIG. 3 (a), transparent electrode layer 2 is stacked on transparent insulation substrate 1. For transparent insulation substrate 1, a glass substrate, for example, or the like may be employed. For transparent electrode layer 2, a layer formed of $SnO_2$ (tin oxide), ITO (Indium Tin Oxide), or ZnO (zinc oxide) may be employed. Transparent electrode layer 2 can be formed by, but not particularly limited to, the well-known thermal CVD, sputtering, evaporation, ion plating, or the like. Instead of stacking transparent electrode layer 2 on transparent insulation substrate 1, a transparent insulation substrate 1 having transparent electrode layer 2 stacked in advance may be employed.

As shown in FIG. 3 (b), a first separation trench 5 separating transparent electrode layer 2 into strips is formed.

First separation trench 5 can be formed by irradiating transparent electrode layer 2 from the side of transparent insulation substrate 1 with a laser beam moving in the direction orthogonal to the series-connection direction to remove transparent electrode layer 2 in strips.

For the laser beam to form first separation trench 5, a YAG (Yttrium Aluminum garnet) laser beam of the fundamental wave (wavelength: 1064 nm), or a $YVO_4$ (Yttrium Orthovanadate) laser beam of the fundamental wave (wavelength: 1064 nm), for example, or the like, may be employed.

As shown in FIG. 3 (c), photoelectric conversion layer 3 is stacked on transparent electrode layer 2 having first separation trench 5 formed. Photoelectric conversion layer 3 can be stacked by plasma CVD, for example, so as to fill first separation trench 5. Photoelectric conversion layer 3 can be provided by, for example, stacking a p layer, i layer and n layer formed of an amorphous silicon thin film sequentially in the cited order from the side of transparent electrode layer 2, and then stacking a p layer, i layer and n layer formed of a microcrystalline silicon thin film in the cited order.

For photoelectric conversion layer 3, there may be employed a structure in which a p layer, i layer, and n layer formed of an amorphous silicon thin film are sequentially stacked; a tandem configuration based on a combination of a structure in which a p layer, i layer, and n layer formed of an amorphous silicon thin film are sequentially stacked and a structure in which a p layer, i layer, and n layer formed of a microcrystalline silicon thin film are sequentially stacked; or a structure in which an intermediate layer such as of ZnO is inserted between a structure in which a p layer, i layer, and n layer formed of an amorphous silicon thin film are sequentially stacked and a structure in which a p layer, i layer, and n layer formed of a microcrystalline silicon thin film are sequentially stacked. Alternatively, a mixture of layers formed of an amorphous silicon thin film and of a microcrystalline silicon thin film for the p layer, the i layer, and the n layer may be employed such as using an amorphous silicon thin film for at least one of the p layer, i layer, and n layer and using a microcrystalline silicon thin film for the remaining p layer, i layer, and n layer. For example, a structure may be employed in which a p layer and i layer formed of an amorphous silicon thin film and an n layer formed of a microcrystalline silicon thin film are combined.

For the aforementioned amorphous silicon thin film, a thin film formed of hydrogenated amorphous silicon type semiconductor (a-Si:H) having the silicon dangling bond terminated by hydrogen may be employed. For the aforementioned microcrystalline silicon thin film, hydrogenated microcrystalline silicon type semiconductor (μc-Si:H) having the silicon dangling bond terminated with hydrogen may be employed.

The thickness of photoelectric conversion layer 3 can be set to, for example, greater than or equal to 200 nm and less than or equal to 5 μm.

Although the above description is based on the case where plasma CVD is employed for forming photoelectric conversion layer 3, the method for forming photoelectric conversion layer 3 is not particularly limited thereto.

As shown in FIG. 3 (d), contact line 6 is formed to separate photoelectric conversion layer 3 in strips.

For example, contact line 6 can be formed by irradiating photoelectric conversion layer 3 from the side of transparent insulation substrate 1 with a laser beam moving in the direction orthogonal to the series-connection direction to remove photoelectric conversion layer 3 in strips. Contact line 6 is formed at a location not overlapping first separation trench 5.

For the laser beam employed in the formation of contact line 6, a YAG laser beam of a second harmonic generation (wavelength: 532 nm), or a $YVO_4$ laser beam of a second harmonic generation (wavelength: 532 nm), for example, may be employed.

As shown in FIG. 3 (e), back electrode layer 4 is stacked on photoelectric conversion layer 3 having contact line 6 formed. Back electrode layer 4 can be stacked by sputtering, or the like.

Although the structure of back electrode layer 4 is not particularly limited, a laminate having a transparent conductor film such as of ZnO and a metal thin film such as of silver or aluminum sequentially stacked in the cited order from the side of transparent insulation substrate 1 can be employed. The thickness of the transparent conductor film can be set to, for example, greater than or equal to 20 nm and less than or equal to 200 nm. The thickness of the metal thin film can be set to, for example, greater than or equal to 100 nm and less than or equal to 1 μm.

Further, a single or a plurality of metal thin films alone may be employed for back electrode layer 4.

However, it is preferable to employ a laminate having a transparent conductor film and a metal thin film stacked in the cited order from the side of transparent insulation substrate 1, as set forth above, for back electrode layer 4. In this case, diffusion of metal atoms from the metal thin film to photoelectric conversion layer 3 can be prevented. Furthermore, the reflectance of sunlight by back electrode layer 4 tends to be improved.

As shown in FIG. 3 (f), second separation trench 7 separating photoelectric conversion layer 3 and back electrode layer 4 is formed. Accordingly, cell string 11 having cell 10 and end cell 10a electrically connected in series in the series-connection direction is provided. Further, a perimeter trench 7a surrounding the perimeter of cell string 11 is formed.

Second separation trench 7 can be formed by irradiating photoelectric conversion layer 3 and back electrode layer 4 from the side of transparent insulation substrate 1 with a laser beam moving in the direction orthogonal to the series-connection direction to remove photoelectric conversion layer 3 and back electrode layer 4 in strips.

Perimeter trench 7a can be formed by irradiating photoelectric conversion layer 3 and back electrode layer 4 from the side of transparent insulation substrate 1 with a laser beam moving in the series-connection direction and the direction orthogonal to the series-connection direction to remove photoelectric conversion layer 3 and back electrode layer 4 in strips so as to surround the perimeter of cell string 11

For the laser beam employed in the formation of second separation trench 7 and perimeter trench 7a, a YAG laser beam of a second harmonic generation (wavelength: 532 nm), or a $YVO_4$ laser beam of a second harmonic generation (wavelength: 532 nm), for example, may be employed.

As shown in FIG. 3 (g), insulation region 12 and laminate 13 are formed. Insulation region 12 and laminate 13 can be formed by removing transparent electrode layer 2, photoelectric conversion layer 3 and back electrode layer 4, located at the perimeter of transparent insulation substrate 1, through laser beam irradiation.

Formation of insulation region 12 and laminate 13 can be performed by irradiating transparent electrode layer 2, photoelectric conversion layer 3 and back electrode layer 4, located outer than and apart from perimeter trench 7a by a predetermined distance with a laser beam and removing the laser-irradiated regions of transparent electrode layer 2, photoelectric conversion layer 3 and back electrode layer 4.

In other words, the removed regions of transparent electrode layer 2, photoelectric conversion layer 3 and back electrode layer 4 correspond to insulation region 12, whereas the non-removed regions of transparent electrode layer 2, photoelectric conversion layer 3 and back electrode layer 4 correspond to laminate 13.

The aforementioned removal step by irradiation with a laser beam is carried out such that photoelectric conversion layer 3 is located on series-connection direction end 2a of transparent electrode layer 2, and in the plan view of FIG. 2 (b), such that series-connection direction end 4a of back electrode layer 4 at the end of cell string 11 and series-connection direction end 2a of transparent electrode layer 2 at the end of cell string 11 do not overlap.

For the laser beam employed in the formation of insulation region 12 and laminate 13, a YAG laser beam of the fundamental wave (wavelength: 1064 nm), or a $YVO_4$ laser beam of the fundamental wave (wavelength: 1064 nm), for example, or the like, may be employed.

Since transparent electrode layer 2 evaporated by the irradiation with a laser beam during formation of insulation region 12 and laminate 13 partially adheres to the side face of photoelectric conversion layer 3 and the like of laminate 13, the adherence of transparent electrode layer 2 to the side face of photoelectric conversion layer 3 at end cell 10a can be suppressed.

Therefore, by providing insulation region 12 with laminate 13 left, degradation of the output of the thin-film solar cell caused by transparent electrode layer 2 adhering to the side face of photoelectric conversion layer 3 at end cell 10a to attain a leak path can be suppressed.

As shown in FIG. 3 (h), the thin-film solar cell of the first embodiment can be fabricated by arranging bus bar 9 on back electrode layer 4 of end cell 10a. The step of arranging bus bar 9 is carried out such that bus bar 9 partially overlaps transparent electrode layer 2 of end cell 10a, in the plan view of FIG. 2(b).

Subsequently, an EVA (EthyleneVinyl Acetate) sheet is provided on the surface of back electrode layer 4. Following provision of a protection film formed of a S-layer stacked film of PET (polyester)/Al (aluminum)/PET on the EVA sheet, thermal compression bonding between transparent insulation substrate 1 and the protection film can be carried out, allowing the thin-film solar cell of the first embodiment to be sealed in EVA.

The thin-film solar cell of the first embodiment fabricated as set forth above can have adherence of transparent electrode layer 2 evaporated by irradiation with a laser beam to the side face of photoelectric conversion layer 3 at end cell 10a suppressed in the fabrication process thereof. It is therefore not necessary to provide an invalid region below bus bar 9 at end cell 10a by forming a separation trench that separates transparent electrode layer 2. Thus, the thin-film solar cell of the first embodiment can have the output improved, as compared to the conventional thin-film solar cell disclosed in PTL 1, since the area for power generation can be set large.

(Second Embodiment)

Figure 4:
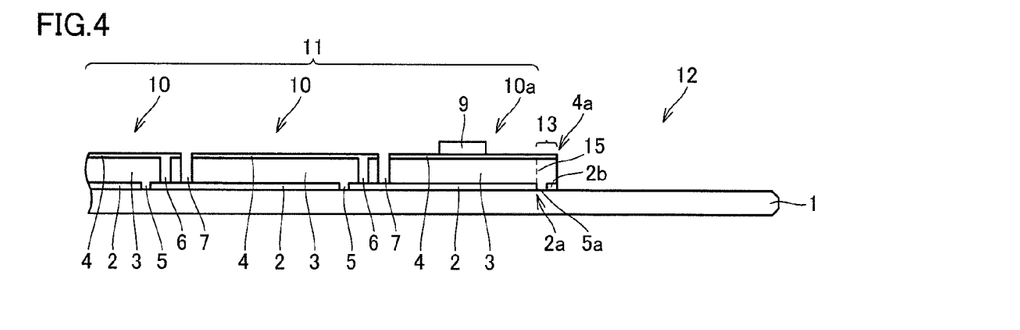
FIG. 4 is a schematic sectional view of a series-connection direction end of cells in a thin-film solar cell according to a second embodiment.
Figure 5:
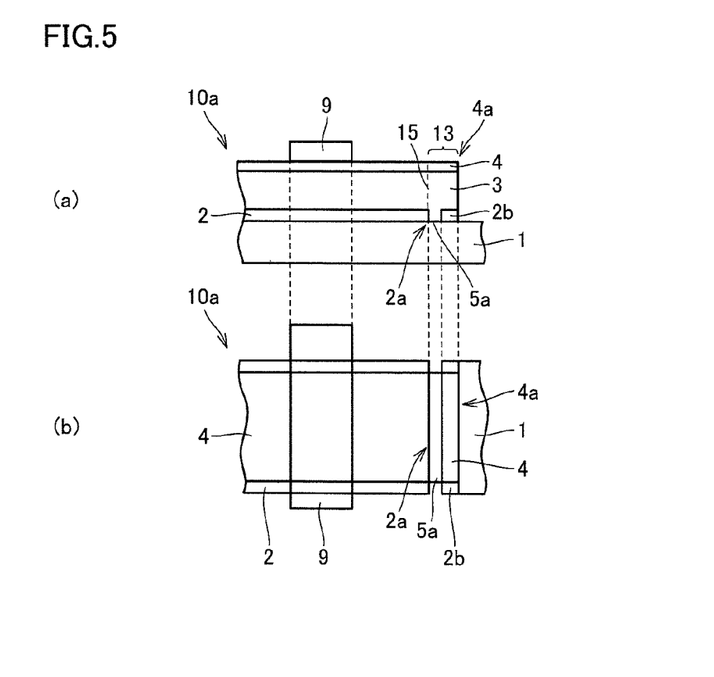
FIG. 5 represents a schematic enlargement of the proximity of an end cell in the thin-film solar cell of the second embodiment shown in FIG. 4, wherein (a) is a sectional view and (b) is a plan view of (a).

FIG. 4 is a schematic sectional view of a series-connection direction end of cells in a thin-film solar cell according to a second embodiment. FIG. 5 represents a schematic enlargement of the proximity of an end cell in the thin-film solar cell of the second embodiment shown in FIG. 4, wherein (a) is a sectional view and (b) is a plan view of (a).

In the thin-film solar cell of the second embodiment, the left side region relative to a broken line 15 shown in FIGS. 4 and 5 (*a*) is equivalent to end cell 10*a*, whereas the right side region relative to broken line 15 is equivalent to laminate 13. In other words, the thin-film solar cell of the second embodiment has a structure in which photoelectric conversion layer 3 of end cell 10*a* in cell string 11 is in contact with laminate 13.

As used herein, laminate 13 includes photoelectric conversion layer 3 provided on transparent insulation substrate 1, and back electrode layer 4 provided on photoelectric conversion layer 3. Laminate 13 includes a transparent electrode layer 2*b* arranged spaced apart from series-connection direction end 2*a* of transparent electrode layer 2 at end cell 10*a*.

The thin-film solar cell of the second embodiment does not have a series-connection direction end 4*a* of back electrode layer 4 located on series-connection direction end 2*a* of transparent electrode layer 2 at end cell 10*a*. Photoelectric conversion layer 3 is located on series-connection direction end 2*a* of transparent electrode layer 2 at end cell 10*a*. Further, series-connection direction end 2*a* of transparent electrode layer 2 at end cell 10*a* is covered with photoelectric conversion layer 3.

An example of a method of fabricating a thin-film solar cell of the second embodiment will be described hereinafter with reference to the schematic sectional views of FIGS. 6 (*a*)-6 (*h*).

Figure 6:
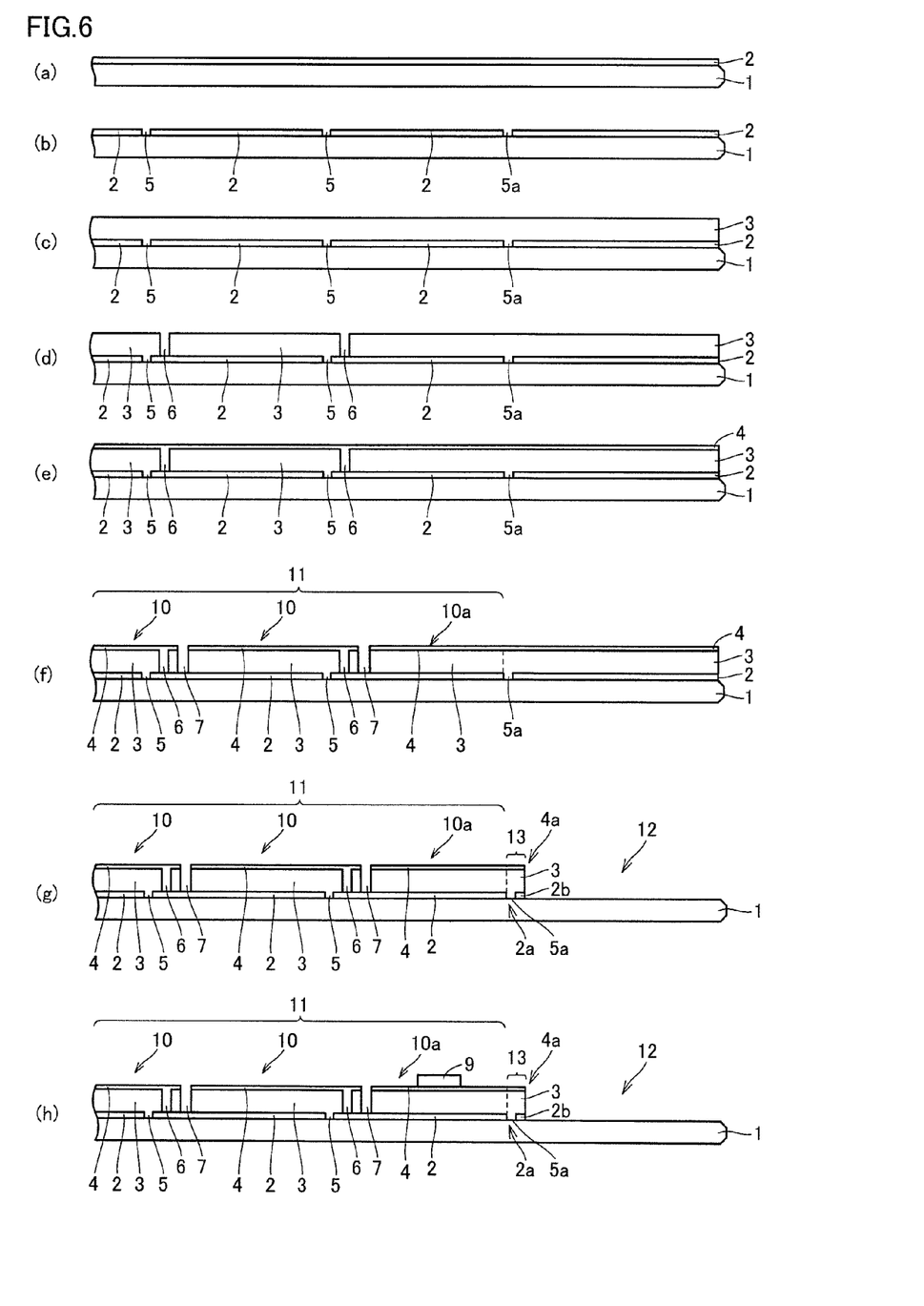

As shown in FIG. 6 (*a*), transparent electrode layer 2 is stacked on transparent insulation substrate 1. As shown in FIG. 6 (*b*), first separation trenches 5 and 5*a* separating transparent electrode layer 2 in strips are formed.

First separation trench 5*a* can be formed by irradiating transparent electrode layer 2 from the side of transparent insulation substrate 1 with a laser beam moving in a direction orthogonal to the series-connection direction to remove transparent electrode layer 2 in strips.

For a laser beam employed in the formation of first separation trench 5*a*, a YAG laser beam of the fundamental wave (wavelength: 1064 nm), or a YVO$_4$ laser beam of the fundamental wave (wavelength: 1064 nm), for example, or the like, may be employed.

As shown in FIG. 6 (*c*), photoelectric conversion layer 3 is stacked on transparent electrode layer 2 having first separation trenches 5 and 5*a* formed. Then, as shown in FIG. 6 (*d*), contact line 6 is formed so as to separate photoelectric conversion layer 3 in strips.

As shown in FIG. 6 (*e*), back electrode layer 4 is stacked on photoelectric conversion layer 3 having contact line 6 formed. As shown in FIG. 6 (*f*), second separation trench 7 separating photoelectric conversion layer 3 and back electrode layer 4 is formed.

A shown in FIG. 6 (*g*), insulation region 12 and laminate 13 are formed. Insulation region 12 and laminate 13 can be formed by irradiating transparent electrode layer 2, photoelectric conversion layer 3 and back electrode layer 4 located outer than and apart from first separation trench 5*a* by a predetermined distance in the series-connection direction with a laser beam in the direction orthogonal to the series-connection direction for removal. Removal of transparent electrode layer 2, photoelectric conversion layer 3 and back electrode layer 4 can be carried out by leaving a portion of transparent electrode layer 2*b* at the side outer than first separation trench 5*a* located at the most end in the series-connection direction of transparent electrode layer 2.

Formation of insulation region 12 and laminate 13 can be carried out by irradiating transparent electrode layer 2, photoelectric conversion layer 3 and back electrode layer 4 located outer than and apart from first separation trench 5*a* by a predetermined distance in the series-connection direction with a laser beam to remove the laser-irradiated regions of transparent electrode layer 2, photoelectric conversion layer 3 and back electrode layer 4.

Specifically, in the outer region from the end of first separation trench 5*a* at the side of end cell 10*a* in the series-connection direction, the removed regions of transparent electrode layer 2, photoelectric conversion layer 3 and back electrode layer 4 are equivalent to insulation region 12, whereas the non-removed regions of transparent electrode layer 2, photoelectric conversion layer 3 and back electrode layer 4 are equivalent to laminate 13.

Since transparent electrode layer 2 evaporated by irradiation with a laser beam will partially adhere to the side face of photoelectric conversion layer 3 and the like of laminate 13 at this stage, adherence of transparent electrode layer 2 to the side face of photoelectric conversion layer 3 at end cell 10*a* can be prevented.

Therefore, the provision of laminate 13 together with insulation region 12 can suppress reduction in the output of the thin-film solar cell caused by transparent electrode layer 2 adhering to the side face of photoelectric conversion layer 3 at end cell 10*a* to attain a leak path.

As shown in FIG. 6 (*h*), the thin-film solar cell of the second embodiment can be fabricated by arranging bus bar 9 on back electrode layer 4 of end cell 10*a*.

The thin-film solar cell of the second embodiment fabricated as set forth above can have adherence of transparent electrode layer 2 evaporated by irradiation with a laser beam to the side face of photoelectric conversion layer 3 at end cell 10*a* suppressed in the fabrication process thereof by virtue of laminate 13 provided in contact with the side face of end cell 10*a*. It is therefore not necessary to provide an invalid region below bus bar 9 at end cell 10*a* by forming a separation trench that separates transparent electrode layer 2. Thus, the thin-film solar cell of the second embodiment can have the output improved, as compared to the conventional thin-film solar cell disclosed in PTL 1, since the area for power generation can be set large.

Elements other than those described above in the present embodiment are similar to those of the first embodiment. Therefore, description thereof will not be repeated.

(Third Embodiment)

Figure 7:
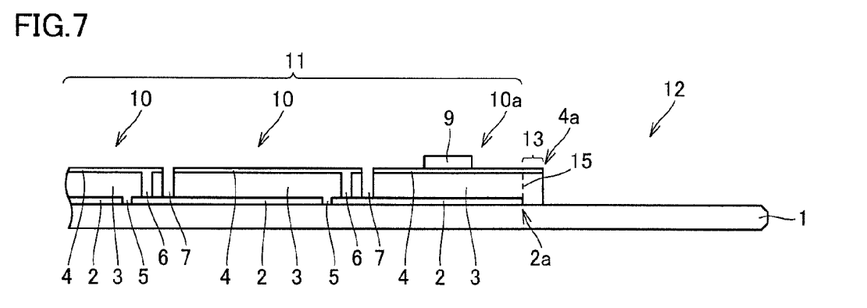
FIG. 7 is a schematic sectional view of a series-connection direction end of cells in a thin-film solar cell according to a third embodiment.
Figure 8:
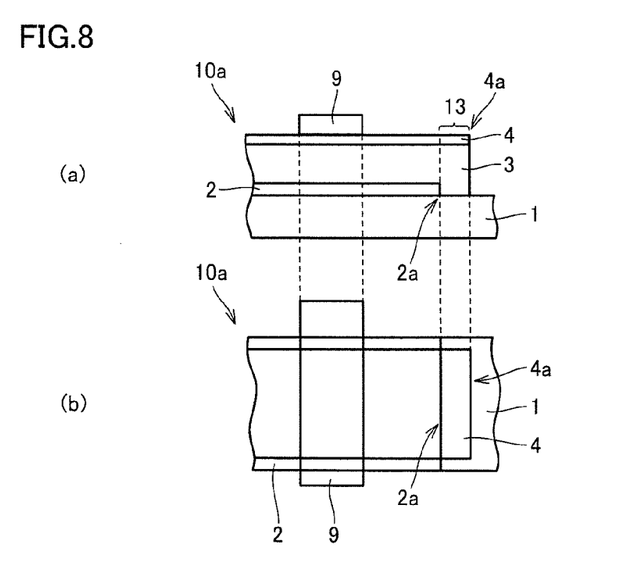
FIG. 8 represents a schematic enlargement of the proximity of an end cell in the thin-film solar cell of the third embodiment shown in FIG. 7, wherein (a) is a sectional view and (b) is a plan view of (a).

FIG. 7 is a schematic sectional view of a series-connection direction end of cells in a thin-film solar cell according to a third embodiment. FIG. 8 represents a schematic enlargement of the proximity of an end cell in the thin-film solar cell of the third embodiment shown in FIG. 7, wherein (a) is a sectional view and (b) is a plan view of (a).

The thin-film solar cell of the third embodiment is characterized in that laminate 13 does not include a transparent electrode layer provided apart from series-connection direction end 2*a* of transparent electrode layer 2 at end cell 10*a*, and that laminate 13 is constituted of only photoelectric conversion layer 3 provided in contact with transparent insulation substrate 1, and back electrode layer 4 provided in contact with photoelectric conversion layer 3.

In the thin-film solar cell of the third embodiment, the left side region relative to broken line 15 in FIGS. 7 and 8 (*a*) is equivalent to end cell 10*a*, whereas the right side region relative to broken line 15 is equivalent to laminate 13. In other words, the thin-film solar cell of the third embodiment has a configuration in which photoelectric conversion layer 3 of end cell 10*a* in cell string 11 forms contact with laminate 13.

In the thin-film solar cell of the third embodiment, series-connection direction end 4*a* of back electrode layer 4 is not located on series-connection direction end 2*a* of transparent electrode later 2 at end cell 10*a*. Further, photoelectric conversion layer 3 is located on series-connection direction end 2a of transparent electrode layer 2 at end cell 10a. Moreover, series-connection direction end 2a of transparent electrode layer 2 at end cell 10a is covered with photoelectric conversion layer 3.

An example of a method of fabricating a thin-film solar cell according to the third embodiment will be described hereinafter with reference to the schematic sectional views of FIGS. 9 (a)-9 (h).

Figure 9:
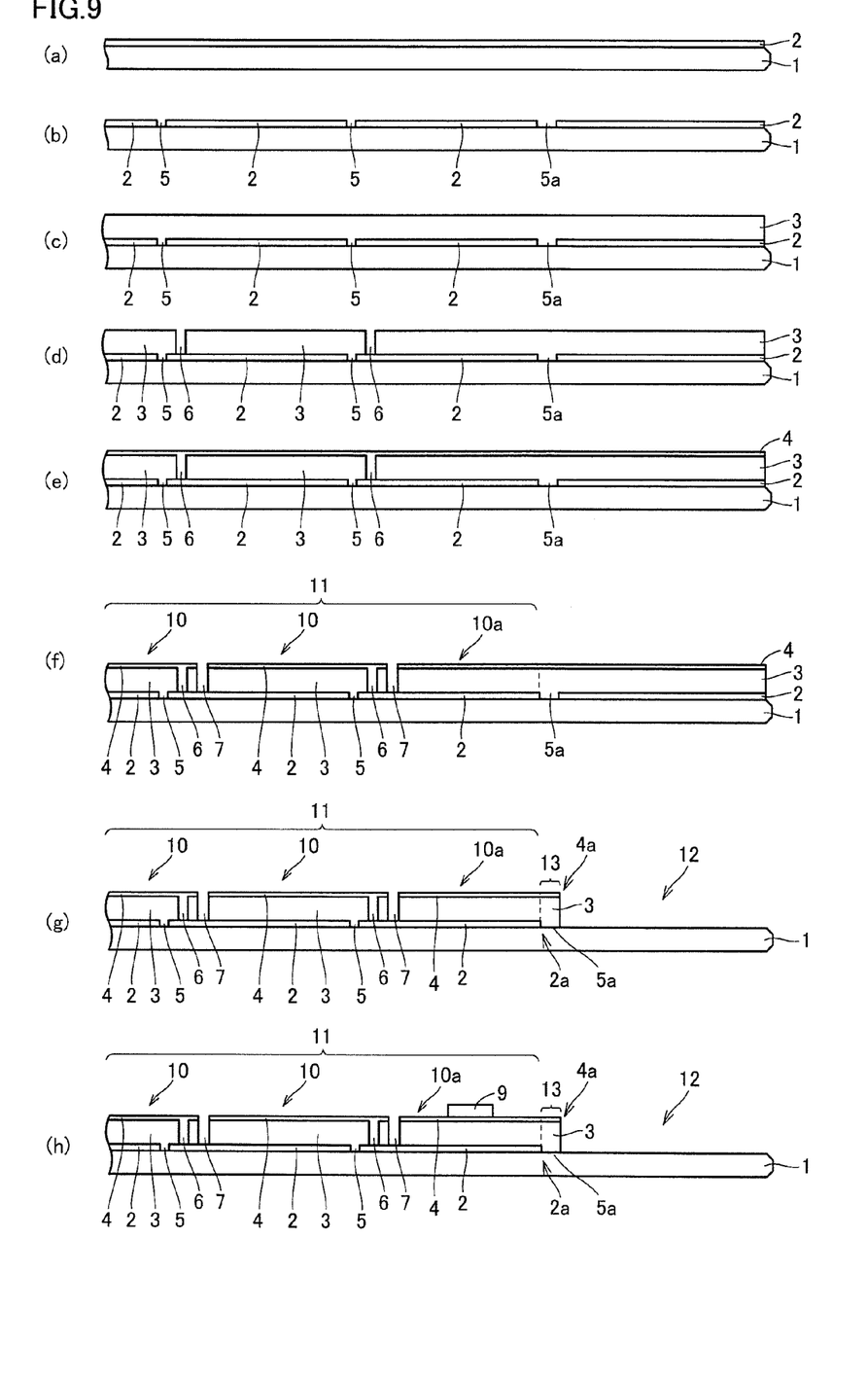

As shown in FIG. 9 (a), transparent electrode layer 2 is stacked on transparent insulation substrate 1. As shown in FIG. 9 (b), first separation trenches 5 and 5a separating transparent electrode layer 2 in strips are formed.

As shown in FIG. 9 (c), photoelectric conversion layer 3 is stacked on transparent electrode layer 2 having first separation trenches 5 and 5a formed. Then, as shown in FIG. 9 (d), contact line 6 is formed so as to separate photoelectric conversion layer 3 in strips.

As shown in FIG. 9 (e), back electrode layer 4 is stacked on photoelectric conversion layer 3 having contact line 6 formed. As shown in FIG. 9 (f), second separation trench 7 separating photoelectric conversion layer 3 and back electrode layer 4 is formed. The steps until this stage are identical to those of the second embodiment.

A shown in FIG. 9 (g), insulation region 12 and laminate 13 are formed. Insulation region 12 and laminate 13 can be formed by, for example, irradiating transparent electrode layer 2, photoelectric conversion layer 3 and back electrode layer 4 located outer than and apart from first separation trench 5a by a predetermined distance in the series-connection direction with a laser beam in the direction orthogonal to the series-connection direction for removal. Removal of transparent electrode layer 2, photoelectric conversion layer 3 and back electrode layer 4 is carried out such that transparent electrode layer 2 at the side outer than first separation trench 5a located at the most end in the series-connection direction of transparent electrode layer 2 is not left.

Formation of insulation region 12 and laminate 13 can be carried out by irradiating transparent electrode layer 2, photoelectric conversion layer 3 and back electrode layer 4 located outer than first separation trench 5a in the series-connection direction with a laser beam to remove the laser-irradiated regions of transparent electrode layer 2, photoelectric conversion layer 3 and back electrode layer 4.

Since transparent electrode layer 2 evaporated by irradiation with a laser beam will partially adhere to the side face of photoelectric conversion layer 3 and the like of laminate 13 similarly in this case, adherence of transparent electrode layer 2 to the side face of photoelectric conversion layer 3 at end cell 10a can be prevented.

Therefore, the provision of laminate 13 together with insulation region 12 can suppress reduction in the output of the thin-film solar cell caused by transparent electrode layer 2 adhering to the side face of photoelectric conversion layer 3 at end cell 10a to attain a leak path.

As shown in FIG. 9 (h), the thin-film solar cell of the third embodiment can be fabricated by arranging bus bar 9 on back electrode layer 4 of end cell 10a.

The thin-film solar cell of the third embodiment fabricated as set forth above can have adherence of transparent electrode layer 2 evaporated by irradiation with a laser beam to the side face of photoelectric conversion layer 3 at end cell 10a suppressed in the fabrication process thereof by virtue of laminate 13 provided in contact with the side face of end cell 10a. It is therefore not necessary to provide an invalid region below bus bar 9 at end cell 10a by forming a separation trench that separates transparent electrode layer 2. Thus, the thin-film solar cell of the third embodiment can have the output improved, as compared to the conventional thin-film solar cell disclosed in PTL 1, since the area for power generation can be set large.

Elements other than those described above in the present embodiment are similar to those of the first embodiment and the second embodiment. Therefore, description thereof will not be repeated.

EXAMPLES

Example 1

As shown in FIG. 3 (a), a transparent insulation substrate 1 formed of a glass substrate was prepared, having a rectangular surface of 560 mm (width)×925 mm (length) with an $SnO_2$ transparent electrode layer 2 formed.

A YAG laser beam of the fundamental wave was directed from the side of transparent insulation substrate 1, moving in the direction orthogonal to the series-connection direction to remove transparent electrode layer 2 in strips, as shown in FIG. 3 (b), to form 50 first separation trenches 5, each having a width of 0.08 mm. First separation trench 5 was formed such that the distance between adjacent first separation trenches 5 is equal only at the region where the cell string is to be formed. Then, transparent insulation substrate 1 was subject to ultrasonic cleaning by pure water.

Next, plasma CVD was employed to sequentially deposit a p layer formed of hydrogenated amorphous silicon type semiconductor (a-Si:H) doped with boron, an i layer formed of hydrogenated amorphous silicon type semiconductor (a-Si:H) that is undoped, and an n layer formed of hydrogenated microcrystalline silicon type semiconductor (μc-Si:H) doped with phosphorus, and also a p layer formed of hydrogenated microcrystalline silicon type semiconductor (μc-Si:H), an i layer formed of hydrogenated microcrystalline silicon type semiconductor (μc-Si:H), and an n layer formed of hydrogenated microcrystalline silicon type semiconductor (μc-Si:H) in the cited order. Thus, photoelectric conversion layer 3 was stacked, as shown in FIG. 3 (c).

Then, a YAG laser beam of the second harmonic generation was directed from the side of transparent insulation substrate 1, moving in the direction orthogonal to the series-connection direction, at an intensity not damaging transparent electrode layer 2, to partially remove photoelectric conversion layer 3 in strips. Thus, contact lines 6 were formed, as shown in FIG. 3 (d).

Next, a transparent conductor film formed of ZnO and a metal thin film formed of silver were sequentially stacked by sputtering to form back electrode layer 4, as shown in FIG. 3 (e).

Then, a YAG laser beam of the second harmonic generation was directed from the side of transparent insulation substrate 1 at an intensity not damaging transparent electrode layer 2, to remove portions of photoelectric conversion layer 3 and back electrode layer 4 in strips. Accordingly, second separation trench 7 and perimeter trench 7a were formed, as shown in FIG. 3 (f). Thus, cell string 11 having cell 10 and end cell 10a electrically connected in series in the series-connection direction was formed.

Second separation trench 7 was formed by irradiating photoelectric conversion layer 3 and back electrode layer 4 from the side of transparent insulation substrate 1 with a YAG laser beam of a second harmonic generation moving in the direction orthogonal to the series-connection direction to remove photoelectric conversion layer 3 and back electrode layer 4 in strips.

Perimeter trench 7a was formed by irradiating photoelectric conversion layer 3 and back electrode layer 4 from the side of transparent insulation substrate 1 with a YAG laser beam of the second harmonic generation moving in the series-connection direction and the direction orthogonal to the series-connection direction to remove photoelectric conversion layer 3 and back electrode layer 4 in strips so as to surround the perimeter of cell string 11.

Then, by directing a YAG laser beam of the fundamental wave from the side of transparent insulation substrate 1 while moving in a direction orthogonal to the series-connection direction, transparent electrode layer 2, photoelectric conversion layer 3 and back electrode layer 4 located at the region outer than perimeter trench 7a were removed in strips, as shown in FIG. 3 (g), to form, on transparent insulation substrate 1, laminate 13 of photoelectric conversion layer 3 and back electrode layer 4 having a width of 1 mm and extending in a direction orthogonal to the series-connection direction at the outer side of perimeter trench 7a, as well as insulation region 12 having a width of 10 mm, and extending in a direction orthogonal to the series-connection direction at the outer side of laminate 13.

The aforementioned removal step by irradiation with a laser beam is carried out such that photoelectric conversion layer 3 is situated on series-connection direction end 2a of transparent electrode layer 2, and in the plan view of FIG. 2 (b), such that series-connection direction end 4a of back electrode layer 4 at the end of cell string 11 and series-connection direction end 2a of transparent electrode layer 2 at the end of cell string 11 do not overlap.

The step set forth above was also carried out at the end of the side opposite to the side of forming perimeter trench 7a in the series-connection direction. A YAG laser beam of the fundamental wave was directed from the side of transparent insulation substrate 1 while moving in the direction orthogonal to the series-connection direction to remove the laminate of transparent electrode layer 2, photoelectric conversion layer 3 and back electrode layer 4 in strips. Thus, an insulation region 12 of 11 mm in width was formed.

Furthermore, a YAG laser beam of the fundamental wave was directed from the side of transparent insulation substrate 1, while moving in the series-connection direction to remove the laminate of transparent electrode layer 2, photoelectric conversion layer 3 and back electrode layer 4 in strips at each end in the direction orthogonal to the series-connection direction. Thus, an insulation region 12 having a width of 11 mm, extending in the series-connection direction was formed at both ends in the direction orthogonal to the series-connection direction.

As shown in FIG. 3 (h), bus bar 9 with a tin-silver-copper coat on copper foil, extending in the direction orthogonal to the series-connection direction, was formed on the surface of back electrode layer 4 of end cell 10a located at one end in the series-connection direction. A bus bar was also formed on the surface of back electrode layer 4 at the other end in the series-connection direction. Thus, bus bar 9 was situated above transparent electrode layer 2 at end cell 10a. The step of arranging bus bar 9 was carried out such that, in the plan view of FIG. 2 (b), bus bar 9 overlaps transparent electrode layer 2 of end cell 10a at least partially.

Subsequently, an EVA sheet was provided on the surface of back electrode layer 4. Following provision of a protection film formed of a 3-layer stacked film of PET/Al/PET on the EVA sheet, thermal compression bonding between transparent insulation substrate 1 and the protection film was carried out to seal transparent insulation substrate 1 and cell string 11 in EVA. Thus, the thin-film solar cell of Example 1 was produced.

In the thin-film solar cell of Example 1, laminate 13 was arranged further outer of photoelectric conversion layer 3 at end cell 10a in the series-connection direction, as shown in FIG. 1. Laminate 13 is a stacked body of photoelectric conversion layer 3 provided on transparent insulation substrate 1 and back electrode layer 4 provided on photoelectric conversion layer 3, arranged spaced apart by a distance of just the width of perimeter trench 7a from photoelectric conversion layer 3 at end cell 10a. In other words, photoelectric conversion layer 3 at end cell 10a constituting cell string 11 was separated from the photoelectric conversion layer on series-connection direction end 2a of transparent electrode layer 2 at the end of cell string 11.

Further, in the thin-film solar cell of Example 1, photoelectric conversion layer 3 of laminate 13 was located on series-connection direction end 2a of transparent electrode layer 2, as shown in FIG. 2 (a). Moreover, in the thin-film solar cell of Example 1, series-connection direction end 4a of back electrode layer 4 at the end of cell string 11 did not overlap series-connection direction end 2a of transparent electrode layer 2 at the end of cell string 11 while bus bar 9 and transparent electrode layer 2 at end cell 10a were at least partially overlapped, in the plan view of FIG. 2 (b).

Using a solar simulator, artificial sunlight of AM1.5 was output at the energy density of 100 mW/cm$^2$ at 25° C. to obtain the I-V curve of the thin-film solar cell of Example 1. From the I-V curve, the output of the thin-film solar cell of Example 1 (short-circuit current ($I_{SC}$)×open voltage ($V_{OC}$)× fill filter (FF)) was calculated. As a result, the power output of the thin-film solar cell of Example 1 was 54 W.

Example 2

As shown in FIG. 6 (a), a transparent insulation substrate 1 formed of a glass substrate was prepared, having a rectangular surface of 560 mm (width)×925 mm (length) with an $SnO_2$ transparent electrode layer 2 formed.

A YAG laser beam of the fundamental wave was directed from the side of transparent insulation substrate 1, while moving in the direction orthogonal to the series-connection direction to remove transparent electrode layer 2 in strips, as shown in FIG. 6(b). Thus, 49 first separation trenches 5, each having a width of 0.08 mm, were formed. Also, 1 first separation trench 5a having a width of 0.08 mm was formed at the end in the series-connection direction. First separation trenches 5 and 5a were formed such that the distance between adjacent first separation trenches 5 and 5a were equal only in the formation region of the cell string. Then, transparent insulation substrate 1 was subjected to ultrasonic cleaning by pure water.

Then, plasma CVD was employed to sequentially deposit a p layer formed of hydrogenated amorphous silicon type semiconductor (a-Si:H) doped with boron, an i layer formed of hydrogenated amorphous silicon type semiconductor (a-Si:H) that is undoped, and an n layer formed of hydrogenated microcrystalline silicon type semiconductor (μc-Si:H) doped with phosphorus, and also a p layer formed of hydrogenated microcrystalline silicon type semiconductor (μc-Si:H), an i layer formed of hydrogenated microcrystalline silicon type semiconductor (μc-Si:H), and an n layer formed of hydrogenated microcrystalline silicon type semiconductor (μc-Si:H) in the cited order. Thus, photoelectric conversion layer 3 was stacked, as shown in FIG. 6 (c).

A YAG laser beam of the second harmonic generation was directed from the side of transparent insulation substrate 1, while moving in the direction orthogonal to the series-connection direction, at an intensity not damaging transparent electrode layer 2, to partially remove photoelectric conversion layer 3 in strips. Thus, contact lines 6 were formed, as shown in FIG. 6 (*d*).

Then, by sequentially depositing a transparent conductor film formed of ZnO and a metal thin film formed of silver by sputtering, back electrode layer 4 was formed, as shown in FIG. 6 (*e*).

Next, by directing a YAG laser beam of the second harmonic generation from the side of transparent insulation substrate 1 at an intensity not damaging transparent electrode layer 2, photoelectric conversion layer 3 and back electrode layer 4 were partially removed in strips. Thus, second separation trench 7 was formed, as shown in FIG. 6 (*f*). Thus, cell string 11 having cell 10 and end cell 10*a* electrically connected in series in the series-connection direction was formed.

Then, by directing a YAG laser of the fundamental wave from the side of transparent insulation substrate 1 while moving in the direction orthogonal to the series-connection direction, transparent electrode layer 2, photoelectric conversion layer 3 and back electrode layer 4 located at the region outer than first separation trench 5*a* located at the most end of transparent electrode layer 2 in the series-connection direction were removed in strips with transparent electrode layer 2 partially remaining. Accordingly, laminate 13 having a width of 1 mm, extending in the direction orthogonal to the series-connection direction, was formed on transparent insulation substrate 1, at the outer side of first separation trench 5*a*. Also, an insulation region 12 having a width of 10 mm, extending in the direction orthogonal to the series-connection direction, was formed at the outer side of laminate 13. Here, laminate 13 was in contact with end cell 10*a*, and insulation region 12 was located at the outer side of laminate 13.

The aforementioned removal step by irradiation with a laser beam is carried out such that photoelectric conversion layer 3 is located on series-connection direction end 2*a* of transparent electrode layer 2, and in the plan view of FIG. 5 (*b*), such that series-connection direction end 4*a* of back electrode layer 4 at the end of cell string 11 and series-connection direction end 2*a* of transparent electrode layer 2 at the end of cell string 11 do not overlap.

The step set forth above was also carried out at the end of the side opposite to the side of forming first separation trench 5*a* in the series-connection direction. A YAG laser beam of the fundamental wave was directed from the side of transparent insulation substrate 1 while moving in the direction orthogonal to the series-connection direction to remove transparent electrode layer 2, photoelectric conversion layer 3 and back electrode layer 4 in strips. Thus, an insulation region 12 of 11 mm in width was formed.

Furthermore, a YAG laser beam of the fundamental wave was directed from the side of transparent insulation substrate 1 while moving in the series-connection direction to remove transparent electrode layer 2, photoelectric conversion layer 3 and back electrode layer 4 in strips at each end in the direction orthogonal to the series-connection direction. Thus, an insulation region 12 having a width of 11 mm, extending in the series-connection direction, was formed at both ends in the direction orthogonal to the series-connection direction.

As shown in FIG. 6 (*h*), bus bar 9 with a tin-silver-copper coat on copper foil, extending in the direction orthogonal to the series-connection direction, was formed on the surface of back electrode layer 4 of end cell 10*a* located at one end in the series-connection direction. A bus bar was also formed on the surface of back electrode layer 4 at the other end in the series-connection direction. Thus, bus bar 9 was situated above transparent electrode layer 2 at end cell 10*a*. The step of arranging bus bar 9 was carried out such that, in the plan view of FIG. 5 (*b*), bus bar 9 overlaps transparent electrode layer 2 of end cell 10*a* at least partially.

Subsequently, an EVA sheet was provided on the surface of back electrode layer 4. Following provision of a protection film formed of a 3-layer stacked film of PET/Al/PET on the EVA sheet, thermal compression bonding between transparent insulation substrate 1 and the protection film was carried out to seal transparent insulation substrate 1 and cell string 11 in EVA. Thus, the thin-film solar cell of Example 2 was produced.

In the thin-film solar cell of Example 2, laminate 13 was arranged further outer of photoelectric conversion layer 3 at end cell 10*a* in the series-connection direction, as shown in FIG. 4. Laminate 13 is a stacked body of photoelectric conversion layer 3 provided in contact with transparent insulation substrate 1 and back electrode layer 4 provided in contact with photoelectric conversion layer 3, arranged in contact with photoelectric conversion layer 3 at end cell 10*a*. Furthermore, series-connection direction end 2*a* of transparent electrode layer 2 at end cell 10*a* constituting cell string 11 was covered with photoelectric conversion layer 3. Moreover, below series-connection direction end 4*a* of back electrode layer 4 at end cell 10*a*, transparent electrode layer 2*b* separated from series-connection direction end 2*a* of transparent electrode layer 2 at end cell 10*a* was formed with photoelectric conversion layer 3 therebetween.

Further, in the thin-film solar cell of Example 2, photoelectric conversion layer 3 was located on series-connection direction end 2*a* of transparent electrode layer 2, as shown in FIG. 5 (*a*). Moreover, in the thin-film solar cell of Example 2, series-connection direction end 4*a* of back electrode layer 4 at the end of cell string 11 did not overlap series-connection direction end 2*a* of transparent electrode layer 2 at the end of cell string 11 while bus bar 9 and transparent electrode layer 2 at end cell 10*a* were at least partially overlapped, in the plan view of FIG. 5 (*b*).

Using a solar simulator, artificial sunlight of AM1.5 was output at the energy density of 100 mW/cm$^2$ at 25° C. to obtain the I-V curve of the thin-film solar cell of Example 1. From the I-V curve, the output of the thin-film solar cell of Example 2 (short-circuit current ($I_{SC}$)×open voltage ($V_{OC}$)× fill filter (FF)) was calculated. As a result, the power output of the thin-film solar cell of Example 2 was 54 W.

Example 3

As shown in FIG. 9 (*a*), a transparent insulation substrate 1 formed of a glass substrate was prepared, having a rectangular surface of 560 mm (width)×925 mm (length) with an SnO$_2$ transparent electrode layer 2 formed.

A YAG laser beam of the fundamental wave was directed from the side of transparent insulation substrate 1, while moving in the direction orthogonal to the series-connection direction to remove transparent electrode layer 2 in strips, as shown in FIG. 9(*b*). Thus, 49 first separation trenches 5, each having a width of 0.08 mm, were formed. Also, 1 first separation trench 5*a* having a width of 0.08 mm was formed at the end in the series-connection direction. First separation trenches 5 and 5*a* were formed such that the distance between adjacent first separation trenches 5 and 5*a* were equal only in the formation region of the cell string. Then, transparent insulation substrate 1 was subjected to ultrasonic cleaning by pure water.

Next, plasma CVD was employed to sequentially deposit a p layer formed of hydrogenated amorphous silicon type semiconductor (a-Si:H) doped with boron, an i layer formed of hydrogenated amorphous silicon type semiconductor (a-Si:H) that is undoped, and an n layer formed of hydrogenated microcrystalline silicon type semiconductor (μc-Si:H) doped with phosphorus, and also a p layer formed of hydrogenated microcrystalline silicon type semiconductor (μc-Si:H), an i layer formed of hydrogenated microcrystalline silicon type semiconductor (μc-Si:H), and an n layer formed of hydrogenated microcrystalline silicon type semiconductor (μc-Si:H) in the cited order. Thus, photoelectric conversion layer 3 was stacked, as shown in FIG. 9 (c).

A YAG laser beam of the second harmonic generation was directed from the side of transparent insulation substrate 1 while moving in the direction orthogonal to the series-connection direction, at an intensity not damaging transparent electrode layer 2, to partially remove photoelectric conversion layer 3 in strips. Thus, contact lines 6 were formed, as shown in FIG. 9 (d).

Then, by sequentially depositing a transparent conductor film formed of ZnO and a metal thin film formed of silver by sputtering, back electrode layer 4 was formed, as shown in FIG. 9 (e).

Next, by directing a YAG laser beam of the second harmonic generation from the side of transparent insulation substrate 1 at an intensity not damaging transparent electrode layer 2, photoelectric conversion layer 3 and back electrode layer 4 were partially removed in strips. Accordingly, second separation trench 7 was formed, as shown in FIG. 9 (f). Thus, cell string 11 having cell 10 and end cell 10a electrically connected in series in the series-connection direction was formed.

Then, by directing a YAG laser of the fundamental wave from the side of transparent insulation substrate 1 while moving in the direction orthogonal to the series-connection direction, transparent electrode layer 2, photoelectric conversion layer 3 and back electrode layer 4 located at the region outer than first separation trench 5a located at the most end of transparent electrode layer 2 in the series-connection direction, at the end of the opposite side, were removed in strips with no transparent electrode layer 2 remaining. Accordingly, laminate 13 having a width of 0.08 mm, extending in the direction orthogonal to the series-connection direction, was formed on transparent insulation substrate 1, at the outer side of first separation trench 5a. Also, an insulation region 12 having a width of 10.92 mm, extending in the direction orthogonal to the series-connection direction, was formed at the outer side of laminate 13. Here, laminate 13 was in contact with end cell 10a, and insulation region 12 was located at the outer side of laminate 13.

The aforementioned removal step by irradiation with a laser beam was carried out such that photoelectric conversion layer 3 is located on series-connection direction end 2a of transparent electrode layer 2, and in the plan view of FIG. 8 (b), such that series-connection direction end 4a of back electrode layer 4 at the end of cell string 11 and series-connection direction end 2a of transparent electrode layer 2 at the end of cell string 11 do not overlap.

The step set forth above was also carried out at the end of the side opposite to the side of forming first separation trench 5a in the series-connection direction. A YAG laser beam of the fundamental wave was directed from the side of transparent insulation substrate 1 while moving in the direction orthogonal to the series-connection direction to remove transparent electrode layer 2, photoelectric conversion layer 3 and back electrode layer 4 in strips. Thus, an insulation region 12 of 11 mm in width was formed.

Furthermore, a YAG laser beam of the fundamental wave was directed from the side of transparent insulation substrate 1 while moving in the series-connection direction to remove transparent electrode layer 2, photoelectric conversion layer 3 and back electrode layer 4 in strips at each end in the direction orthogonal to the series-connection direction. Thus, an insulation region 12 having a width of 11 mm, extending in the series-connection direction, was formed at both ends in the direction orthogonal to the series-connection direction.

As shown in FIG. 9 (h), bus bar 9 with a tin-silver-copper coat on copper foil, extending in the direction orthogonal to the series-connection direction, was formed on the surface of back electrode layer 4 of end cell 10a located at one end in the series-connection direction. A bus bar was also formed on the surface of back electrode layer 4 at the other end in the series-connection direction. Thus, bus bar 9 was situated above transparent electrode layer 2 at end cell 10a. The step of arranging bus bar 9 was carried out such that, in the plan view of FIG. 8 (b), bus bar 9 overlaps transparent electrode layer 2 of end cell 10a at least partially.

Subsequently, an EVA sheet was provided on the surface of back electrode layer 4. Following provision of a protection film formed of a 3-layer stacked film of PET/Al/PET on the EVA sheet, thermal compression bonding between transparent insulation substrate 1 and the protection film was carried out to seal transparent insulation substrate 1 and cell string 11 in EVA. Thus, the thin-film solar cell of Example 3 was produced.

In the thin-film solar cell of Example 3, laminate 13 was arranged further outer of photoelectric conversion layer 3 at end cell 10a in the series-connection direction, as shown in FIG. 7. Laminate 13 is a stacked body of photoelectric conversion layer 3 provided in contact with transparent insulation substrate 1 and back electrode layer 4 provided in contact with photoelectric conversion layer 3, arranged in contact with photoelectric conversion layer 3 at end cell 10a. Furthermore, series-connection direction end 2a of transparent electrode layer 2 at end cell 10a constituting cell string 11 was covered with photoelectric conversion layer 3. Moreover, below series-connection direction end 4a of back electrode layer 4 at end cell 10a, transparent electrode layer 2 was not formed.

Further, in the thin-film solar cell of Example 3, photoelectric conversion layer 3 was located on series-connection direction end 2a of transparent electrode layer 2, as shown in FIG. 8 (a). Moreover, in the thin-film solar cell of Example 3, series-connection direction end 4a of back electrode layer 4 at the end of cell string 11 did not overlap series-connection direction end 2a of transparent electrode layer 2 at the end of cell string 11 while bus bar 9 and transparent electrode layer 2 at end cell 10a were at least partially overlapped, in the plan view of FIG. 8 (b).

Using a solar simulator, artificial sunlight of AM1.5 was output at the energy density of 100 mW/cm$^2$ at 25° C. to obtain the I-V curve of the thin-film solar cell of Example 3. From the I-V curve, the output of the thin-film solar cell of Example 3 (short-circuit current ($I_{SC}$)×open voltage ($V_{OC}$)× fill filter (FF)) was calculated. As a result, the power output of the thin-film solar cell of Example 3 was 54 W.

Comparative Example 1

A thin-film solar cell of Comparative Example 1 was produced in a manner similar to that of Example 1, except that separation trench 5 was formed at a region of transparent electrode layer 2 below bus bar 9 arranged on the surface of back electrode layer 4 at end cell 10a, and that transparent electrode layer 2, photoelectric conversion layer 3 and back electrode layer 4, located at the outer side of end cell 10a were all removed in strips by irradiation with a YAG laser beam of the fundamental wave to form an insulation region 12 having a width of 11 mm. Specifically, the thin-film solar cell of Comparative Example 1 had a structure as shown in FIG. 10. Insulation region 12 was arranged adjacent to end cell 10a.

Then, using a solar simulator, artificial sunlight of AM1.5 was output at the energy density of 100 mW/cm$^2$ at 25° C. to obtain the I-V curve of the thin-film solar cell of Comparative Example 1. From the I-V curve, the output of the thin-film solar cell of Comparative Example 1 (short-circuit current ($I_{SC}$)×open voltage ($V_{OC}$)×fill filter (FF)) was calculated. As a result, the power output of the thin-film solar cell of Comparative Example 1 was 53.5 W.

<Evaluation>

It was confirmed that the output of the thin-film solar cells of Examples 1-3 was improved than the output of the thin-film solar cell of Comparative Example 1. This is probably because a first separation trench 5 does not have to be formed at the region of transparent electrode layer 2 below bus bar 9 at end cell 10a since adherence of the transparent electrode layer caused by irradiation with a YAG laser of the fundamental wave to end cell 10a can be prevented by laminate 13 in the thin-film solar cell of Examples 1-3, as compared to the thin-film solar cell of Comparative Example 1, allowing a larger region for power generation at end cell 10a.

It is to be understood that the embodiments and examples disclosed herein are only by way of example, and not to be taken by way of limitation. The scope of the present invention is not limited by the description above, but rather by the terms of the appended claims, and is intended to include any modifications within the scope and meaning equivalent to the terms of the claims.

INDUSTRIAL APPLICABILITY

The present invention is applicable to a thin-film solar cell and a method of fabricating a thin-film solar cell.

REFERENCE SIGNS LIST 1 transparent insulation substrate; 2 transparent electrode layer; 2a end; 3 photoelectric conversion layer; 4 back electrode layer; 4a end; 5, 5a first separation trench; 6 contact line; 7 second separation trench; 7a perimeter trench; 9 bus bar; 10 cell; 10a end cell; 11 cell string; 12 insulation region; 13 laminate; 15 broken line; 100 thin-film solar cell; 101 translucent insulation substrate; 102 transparent conductor film; 103 photoelectric conversion layer; 104 back electrode layer; 105 separation line; 106 contact line; 107 separation line; 108 conductive tape; 109 bus bar; 110 cell; 111 cell string; 112 insulation region; 113 invalid region; 114 laser beam.

The invention claimed is:

1. A thin-film solar cell, comprising:
a cell having a transparent electrode layer, a photoelectric conversion layer, and a back electrode layer stacked on a transparent insulation substrate, a plurality of said cells connected in series to constitute a cell string,
a bus bar arranged on a back electrode layer of an end cell constituting the cell string,
having a photoelectric conversion layer on a series-connection direction end of said transparent electrode layer in one end of a series-connection direction,
in plan view of said one end of said series-connection direction,
a series-connection direction end of a back electrode layer at an end of said cell string and the series-connection direction end of the transparent electrode layer at an end of said cell string not overlapping, and
said bus bar and a transparent electrode layer of the end cell constituting said cell string overlapping at least partially.

2. The thin-film solar cell according to claim 1, wherein a photoelectric conversion layer of the end cell constituting said cell string and a photoelectric conversion layer on the series-connection direction end of the transparent electrode layer at the end of said cell string are separated.

3. The thin-film solar cell according to claim 1, wherein the series-connection direction end of the transparent electrode layer at the end cell constituting said cell string is covered with a photoelectric conversion layer.

4. The thin-film solar cell according to claim 3, wherein a transparent electrode layer separated from the series-connection direction end of the transparent electrode layer at the end cell constituting said cell string is formed below the series-connection direction end of the back electrode layer at the end cell constituting said cell string with a photoelectric conversion layer therebetween.

5. The thin-film solar cell according to claim 1, wherein said bus bar is arranged spaced apart from the series-connection direction end of said back electrode layer at the end of said cell string.

6. A thin-film solar cell comprising:
a cell having a transparent electrode layer, a photoelectric conversion layer, and a back electrode layer stacked on a transparent insulation substrate, a plurality of said cells connected in series to constitute a cell string,
a bus bar arranged on a back electrode layer of an end cell constituting the cell string,
having a photoelectric conversion layer on a series-connection direction end of said transparent electrode layer,
in plan view,
a series-connection direction end of a back electrode layer at an end of said cell string and the series-connection direction end of the transparent electrode layer at an end of said cell string not overlapping, and
said bus bar and a transparent electrode layer of the end cell constituting said cell string overlapping at least partially, and
said bus bar arranged spaced apart from the series-connection direction end of said back electrode layer at the end of said cell string.

* * * * *